US007170811B1

(12) United States Patent
Allen

(10) Patent No.: US 7,170,811 B1
(45) Date of Patent: Jan. 30, 2007

(54) SEPARATE VARIABLE POWER SUPPLY TO ON-CHIP MEMORY USING EXISTING POWER SUPPLIES

(75) Inventor: David H. Allen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/216,388

(22) Filed: Aug. 31, 2005

(51) Int. Cl.
*G11C 5/14* (2006.01)

(52) U.S. Cl. .................. 365/226; 365/189.09; 365/63; 365/230.03

(58) Field of Classification Search ............... 365/226, 365/189.09, 230.03, 63
See application file for complete search history.

(56) References Cited

U.S. PATENT DOCUMENTS 4,638,464 A * 1/1987 Cranford et al. ............ 365/226

2002/0104031 A1 * 8/2002 Tomlinson et al. ......... 365/226

* cited by examiner

*Primary Examiner*—Huan Hoang
(74) *Attorney, Agent, or Firm*—Bockhop & Associates LLC

(57) ABSTRACT

A power supply for on-chip memory on an integrated circuit powered by a voltage source includes an on-chip logic circuit, a voltage identification bus and an on-chip variable voltage regulator. The on-chip logic circuit receives power from an off-chip variable power supply and generates a voltage identification signal that provides control information regarding a desired current state of the off-chip variable power supply. The voltage identification bus receives the voltage identification signal from the on-chip logic circuit. The on-chip variable voltage regulator receives power from the voltage source. The on-chip voltage regulator is controlled by an on-chip voltage regulator control logic circuit that is in communication with the voltage identification bus. The on-chip voltage regulator control logic circuit is responsive to the voltage identification signal and causes the on-chip variable voltage regulator to supply an array voltage to an array that tracks the current state of the off-chip variable power supply.

14 Claims, 3 Drawing Sheets

SEPARATE VARIABLE POWER SUPPLY TO ON-CHIP MEMORY USING EXISTING POWER SUPPLIES

BACKGROUND OF THE INVENTION

1. Field of the Invention

The present invention relates to integrated circuits and, more specifically, to a power supply used in memory circuits.

2. Description of the Prior Art

Very large scale integrated circuit (VLSI) chip designs often contain a variety of circuit types to meet the functional requirements of the product. These include static CMOS circuits for control and dataflow, six-transistor cell-based SRAM arrays for high-density storage, analog circuits for clock phase alignment and other non-digital functions. This variety of circuit design styles, and their interaction with the wafer manufacturing technology, often requires these circuits to operate under different voltage supply levels. At a minimum, a requirement for lower power supply noise or less variation (tolerance) often forces the system designer to supply more than one power supply so that a higher supply (e.g. AVDD) than can be regulated on-chip.

Several existing integrated circuits include logic circuits and memory arrays. The logic circuits may be able to detect special modes where a lower voltage may be applied to both the logic circuits and the memory arrays. Typically, such modes involve lowering the clock frequency of the integrated circuit. For example, when a processor is in an idle state, it may be desirable to enter a low frequency state. In such a state, the voltage of the power supply to the logic circuits and memory arrays may be reduced, corresponding to the lower demand for current flow in the circuits. Lowering the voltage from the power supply will decrease heat dissipation and improve the computing power per watt per unit area ratio (which is one measure of overall performance) of the integrated circuit. In another example, an integrated circuit may be used with an entertainment device, such as a video game player. In one mode, the video game player may used to play a DVD and it is desirable to reduce noise generated by the video game player by slowing (or disabling) its fan. This may be accomplished in part by reducing the power supply voltage to the logic circuits and memory arrays in the integrated circuits, thereby reducing the heat dissipated by such circuits.

One type of variable power supply for logic and arrays enables "tuning" of the supply voltage to optimize frequency and power. This technique (called "adaptive power supply") allows slow chips with low DC leakage to be operated at a higher supply voltage than are fast parts with high leakage. This allows a larger fraction of the functionally correct circuits to meet the frequency and power limits of the product. The variable power supply (VDD) is typically supplied through an off-chip voltage regulator since an on-chip voltage regulator capable of supplying power to nearly the entire chip would be prohibitively large in area. The external voltage regulator (VREG) is controlled by Voltage Identification (VID) buss (typically 1–5 bits) which are generated by on-chip logic. The VID setting is typically determined at manufacturing test, during which tests are performed to characterize the frequency and power properties of the individual chip, and stored in non-volatile memory (e.g., electronic fuses or EPROM). The on-chip logic bases the VID setting on this data or other conditions (e.g., if the chip is under power-up, low-power mode, or other conditions at which the programmed VID setting is not appropriate). On the same chip, it remains useful to supply a second separate power supply to other circuits (e.g., analog circuits).

More recent wafer manufacturing technologies have introduced increased variability in the properties of devices. This variability has especially impacted the design of SRAM-cell based memory arrays. The balance between cell read/write performance and cell stability is becoming more and more difficult to maintain. Both cell stability and read/write performance can impact product manufacturing yields. Improving the performance of the cell by making it larger results in a greater area of the chip dedicated to arrays and a larger, more expensive chip. A higher supply voltage on the cell array improves the margin in both performance and stability. However, use of a higher supply for all circuits on a VLSI chip somewhat negates the power savings benefit of more advanced technologies that allow equivalent or improved performance at lower supply voltages. Therefore, a compromise is to supply static logic with a lower supply voltage (VDD) and arrays with a second somewhat-higher supply (VCS). The advantage of the adaptive power supply technique described earlier is lost unless the core voltage (VDD) and the array voltage (VCS) are varied. In addition, since the arrays and logic must communicate on-chip, it becomes difficult to design a chip such that the arrays are on a fixed, higher supply while the logic is on a varying (higher or lower) supply.

As shown in FIG. 1, a typical existing integrated circuit chip 100 includes input/output (I/O) circuitry 112, logic circuitry 114, array circuitry 116 and analog circuitry 118, such as clock phase alignment (PLL) circuits. The I/O circuitry 112 is supplied by an off-chip power source (IO-VDD) and the analog circuitry 118 is supplied by another off-chip power source (AVDD), the power from which is regulated by a voltage regulator 124. The logic circuitry 114 and the array circuitry 116 are driven by a common power source (V), the power from which is regulated by a first off-chip voltage regulator 120 for the logic circuitry 114 and a second off-chip voltage regulator 122 for the array circuitry 116. The logic circuitry 114 provides a first voltage identification feedback signal (VID_L) to the logic voltage regulator 120 and a second voltage identification feedback signal (VID_A) to the array voltage regulator 116. The VID_A signal ensures that the array voltage regulator 116 tracks the voltage level output from the logic voltage regulator 120. Thus, when the logic voltage regulator 120 enters a reduced voltage state, the array voltage regulator 116 will enter a similar reduced voltage state, possibly with a voltage offset (e.g., 100 mV) that meets the operating requirements of the array circuit.

Providing separate power supplies at the system level is costly and therefore avoided where possible, but in the case of critical circuits such as clock phase alignment (PLL) the benefit of separate supplies is often worth the cost.

Therefore, there is a need for a power supply in which both the core (VDD) and array (VCS) supplies track each other employing on-chip voltage regulators.

SUMMARY OF THE INVENTION

The disadvantages of the prior art are overcome by the present invention which, in one aspect, is a power supply for on-chip memory on an integrated circuit powered by a voltage source, wherein the integrated circuit includes at least one array. The variable power supply includes an on-chip logic circuit, a voltage identification bus and an on-chip variable voltage regulator. The on-chip logic circuit receives power from an off-chip variable power supply and generates a voltage identification signal that provides control information regarding a desired current state of the off-chip variable power supply. The voltage identification bus receives the voltage identification signal from the on-chip logic circuit. The on-chip variable voltage regulator receives power from the voltage source and is controlled by an on-chip voltage regulator control logic circuit that is in communication with the voltage identification bus. The on-chip voltage regulator control logic circuit is responsive to the voltage identification signal and causes the on-chip variable voltage regulator to supply an array voltage to the array that tracks the current state of the off-chip variable power supply.

In another aspect, the invention is a power supply for on-chip memory on an integrated circuit powered by a voltage source, in which the integrated circuit includes a plurality of arrays. The variable power supply includes an on-chip logic circuit, a voltage identification bus and a plurality of on on-chip variable voltage regulators. The on-chip logic circuit receives power from an off-chip variable power supply and generates a voltage identification signal that provides control information regarding a desired current state of the off-chip variable power supply. The voltage identification signal includes a global voltage identification sub-signal indicative of a current state of power usage by the on-chip logic circuit and a plurality of array-specific voltage identification sub-signals. Each array-specific voltage identification sub-signal is indicative of an array-specific power usage parameter. The voltage identification bus receives the voltage identification signal from the on-chip logic circuit. The plurality of on-chip variable voltage regulators each receives power from the voltage source. Each on-chip voltage regulator is controlled by a corresponding on-chip voltage regulator control logic circuit that is in communication with the voltage identification bus and that is responsive to the voltage identification signal. The on-chip voltage regulator control logic circuit causes the on-chip variable voltage regulator to supply an array voltage that tracks the current state of the off-chip variable power supply with a preselected offset. Each array voltage supplies power to a selected array.

In yet another aspect, the invention is a method of supplying power to components on an integrated circuit that includes at least one on-chip array and an on-chip logic circuit. In the method, an on-chip voltage regulator is supplied with power from an off-chip power source. A voltage identification signal provides control information regarding a desired current state of the off-chip variable power supply. The voltage identification signal is transmitted to an off-chip voltage regulator that supplies the logic circuitry with power. The voltage identification signal is also transmitted to an on-chip voltage regulator that supplies power to the array. The on-chip voltage regulator is caused to track the off-chip voltage regulator as a function of the voltage identification signal.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
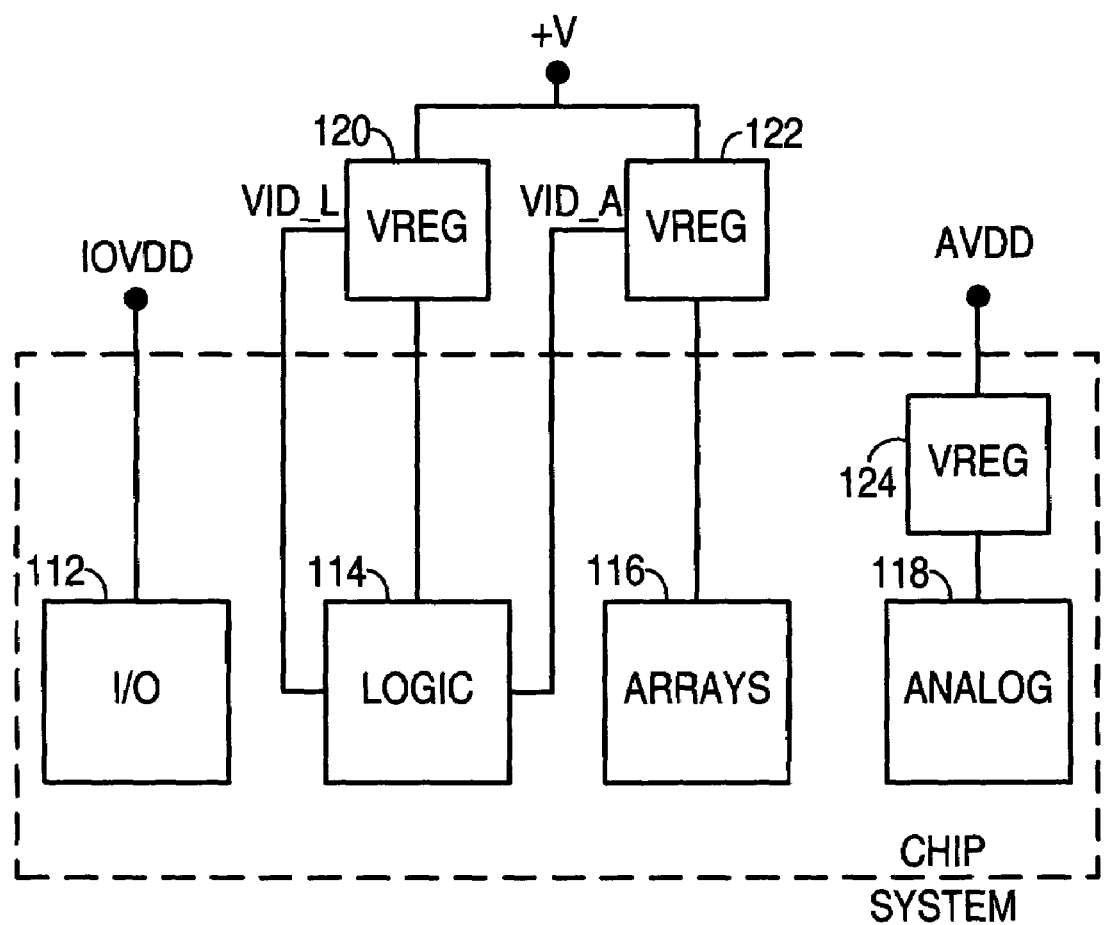
FIG. 1 is a schematic diagram of a prior art system.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 2:
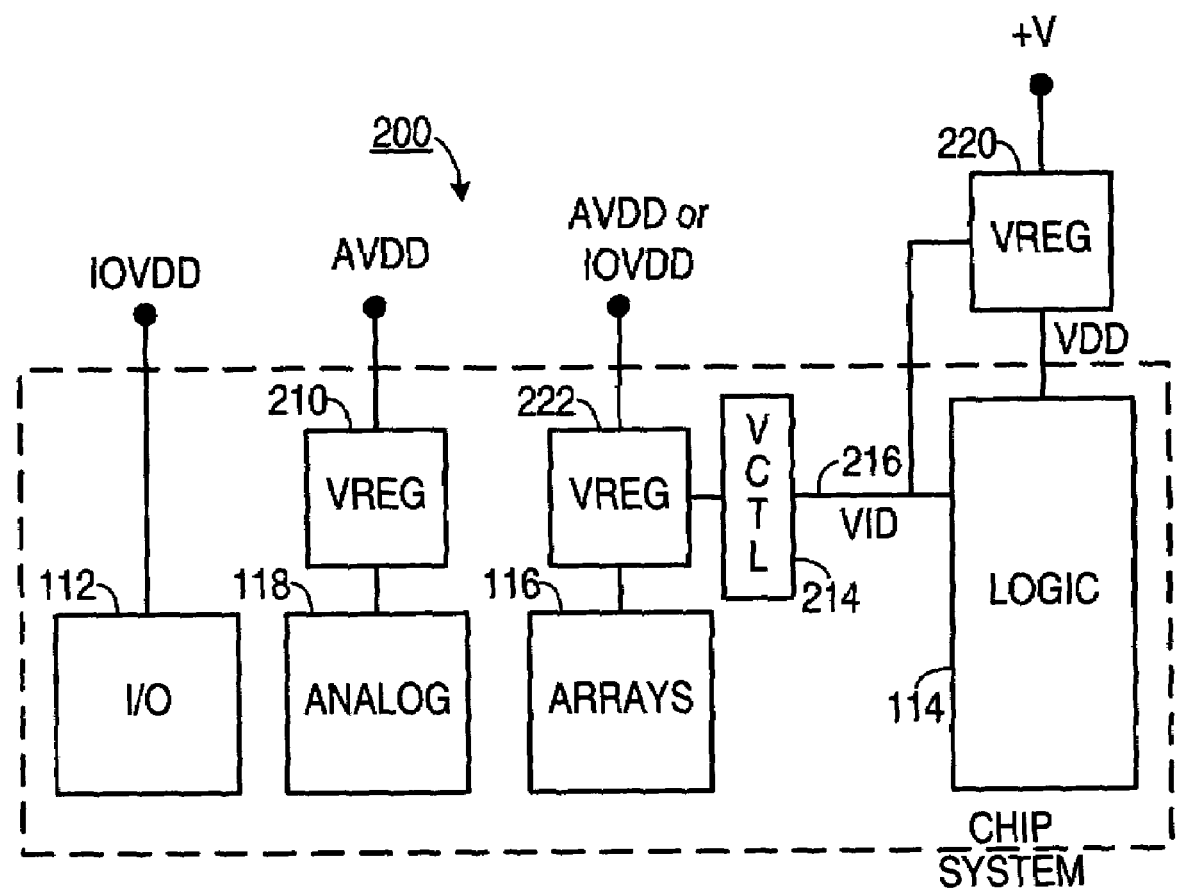
FIG. 2 is a schematic diagram of a power supply according to a first illustrative embodiment of the invention.

As shown in FIG. 2, one embodiment of the invention includes a power supply 200 for memory arrays 116 that reside on an integrated circuit chip. On the chip is found input/output circuits 112 that are powered by an off-chip I/O voltage source (referred to as "IOVDD"), analog circuits 118 that are powered by an off-chip analog voltage source (referred to as "AVDD"), a logic circuit 114 that is powered from a common power source (referred to as "+V") via an off-chip voltage regulator 220, and one or more arrays 116.

The off-chip voltage regulator 220 provides a variable voltage to the logic circuit 114 that corresponds to the power requirements of the logic circuit 114. The logic circuit 114 generates a voltage identification signal (VID) that provides control information regarding a desired current state of the off-chip variable power supply and is, thus, indicative of a current state of the off-chip variable voltage regulator 220. The VID signal is transmitted onto a VID bus 216.

The arrays are powered by an on-chip voltage regulator 222 that is controlled by an on-chip voltage regulator control circuit 214 that is responsive to the VID signal on the VID bus 216. The voltage regulator 222 receives power from an off-chip power source, such as the IOVDD or AVDD. The voltage regulator control 214 ensures that the voltage from the voltage regulator 222 supplies the arrays 116 with a voltage that tracks the current state of the off-chip variable power supply from the off-chip variable voltage regulator 220. For example, the voltage from the voltage regulator 222 could be set to have a voltage that is greater (for example, by 100 mV) than the voltage of the off-chip variable voltage regulator 220.

Figure 3:
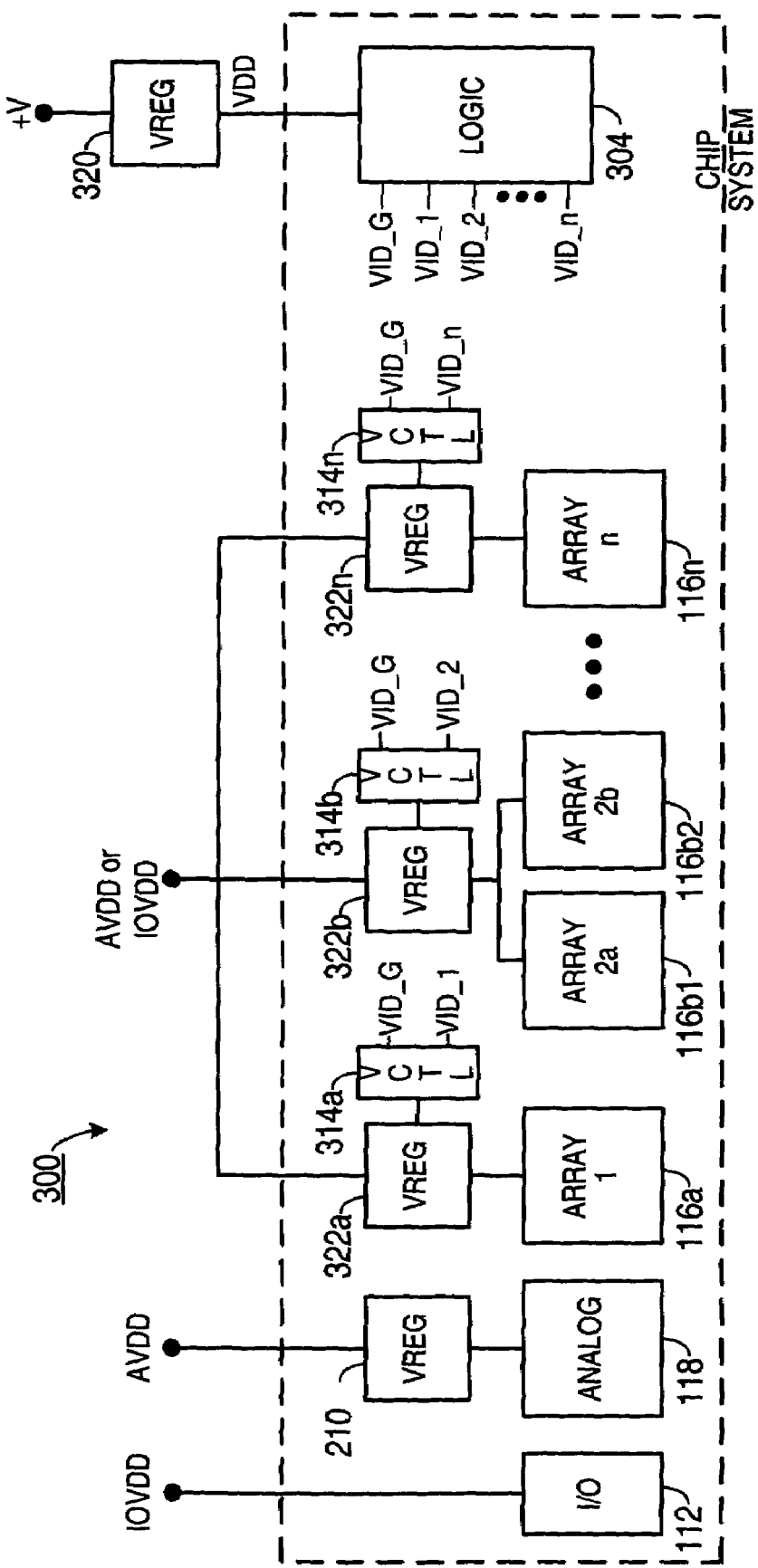
FIG. 3 is a schematic diagram of a power supply according to a second illustrative embodiment of the invention.

As shown in FIG. 3, one embodiment of the invention is an on-chip power supply 300 that allows control of several different arrays 116a–116n, wherein each array, or group of arrays (such as 116b1 and 116b2) requires a voltage that tracks the voltage of an off-chip variable voltage regulator 320 by several different amounts. In such a case, each array (or group of arrays) has a different voltage regulator 322a–n and a corresponding voltage regulator control 314a–n. The logic circuit 304 generates a global VID signal (VID_G), that provides information about the current state of the voltage VDD supplied from the voltage regulator 320, and a plurality of array-specific VID signals (VID_1–VID_n) that are put onto the VID bus (not shown explicitly on this figure). Each voltage regulator control 314a–n receives the global VID signal and one of the plurality of array-specific VID signals that provides information about the voltage differential by which the voltage regulator is to track the VDD voltage. Each voltage regulator control 314a–n logically combines the VID_G signal with its array-specific VID signal to control its corresponding voltage regulator 322a–n to output the desired voltage. For example, VID_1 might indicate that the voltage to "ARRAY 1" 116a is supposed to stay 100 mV above VDD, causing voltage regulator control 314a to drive voltage regulator 322a to output a voltage equal to VDD plus 100 mV. On the other hand, VID_2 might indicate that the voltage to "ARRAY 2a" 116b1 and "ARRAY 2b" 116b2 is to maintained at 50 mV below VDD, thereby causing voltage regulator control 314b to drive voltage regulator 322b to output a voltage equal to VDD plus 150 mV. This embodiment provides an advantage by allowing the voltage supply to arrays (or groups of arrays) to be individually tailored to optimize performance and stability of each array.

The invention provides improved yields, density, power, and performance using the existing separate power supply typically supplied for analog or I/O circuits without increasing the cost of the system by requiring separate power supplies for on-chip arrays.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A variable power supply for on-chip memory on an integrated circuit powered by a voltage source, the integrated circuit including at least one array, the variable power supply comprising:
   a. an on-chip logic circuit that receives power from an off-chip variable power supply and that generates a voltage identification signal that provides control information regarding a desired current state of the off-chip variable power supply;
   b. a voltage identification bus that receives the voltage identification signal from the on-chip logic circuit; and
   c. an on-chip variable voltage regulator, that receives power from the voltage source, the on-chip voltage regulator controlled by an on-chip voltage regulator control logic circuit that is in communication with the voltage identification bus and that is responsive to the voltage identification signal, the on-chip voltage regulator control logic circuit causing the on-chip variable voltage regulator to supply an array voltage to the array that tracks the current state of the off-chip variable power supply.

2. The power supply of claim 1, wherein the integrated circuit includes a plurality of arrays and wherein the voltage identification signal includes a global voltage identification sub-signal, indicative of a power usage state of the logic circuit, and a plurality of array-specific voltage identification sub-signals, each indicative of an array-specific power usage parameter, and wherein each of the arrays has associated with it a different on-chip variable voltage regulator that is responsive to both the global voltage identification sub-signal and a different array-specific voltage identification sub-signal of the plurality of array-specific voltage identification sub-signals, so as to supply an array-specific voltage that tracks the current state of the off-chip variable power supply.

3. The power supply of claim 1, wherein the off-chip variable power supply comprises a voltage regulator that is responsive to the voltage identification signal.

4. The power supply of claim 2, wherein each of the plurality of array-specific voltage identification sub-signals indicates a predefined voltage offset associated with a corresponding array.

5. The power supply of claim 1, wherein the voltage source comprises a voltage source for an analog circuit.

6. The power supply of claim 1, wherein the voltage source comprises a voltage source for an input/output circuit.

7. A variable power supply for on-chip memory on an integrated circuit powered by a voltage source, the integrated circuit including a plurality of arrays, the variable power supply comprising:
   a. an on-chip logic circuit that receives power from an off-chip variable power supply and that generates a voltage identification signal that provides control information regarding a desired current state of the off-chip variable power supply, the voltage identification signal including a global voltage identification sub-signal indicative of a current state of power usage by the on-chip logic circuit and a plurality of array-specific voltage identification sub-signals, each array-specific voltage identification sub-signal indicative of an array-specific power usage parameter;
   b. a voltage identification bus that receives the voltage identification signal from the on-chip logic circuit; and
   c. a plurality of on-chip variable voltage regulators, each receiving power from the voltage source, each on-chip voltage regulator controlled by a corresponding on-chip voltage regulator control logic circuit that is in communication with the voltage identification bus and that is responsive to the voltage identification signal, the on-chip voltage regulator control logic circuit causing the on-chip variable voltage regulator to supply an array voltage that tracks the current state of the off-chip variable power supply with a preselected offset, each array voltage supplying power to a selected array.

8. The power supply of claim 7, wherein the off-chip variable power supply is capable of varying a power output level so as to correspond to at least one predetermined states of the integrated circuit.

9. The power supply of claim 7, wherein at least one of the a plurality of on on-chip variable voltage regulators drives more than one array.

10. A method of supplying power to components on an integrated circuit, the integrated circuit including at least one on-chip array and an on-chip logic circuit, comprising the steps of:
    a. supplying an on-chip voltage regulator with power from an off-chip power source;
    b. generating a voltage identification signal that provides control information indicating a desired current state of power usage by the logic circuitry employing on-chip logic circuitry;
    c. transmitting the voltage identification signal to the off-chip voltage regulator that supplies the logic circuitry with power; and
    d. transmitting the voltage identification signal to an on-chip voltage regulator that supplies power to the array; and
    e. causing the on-chip voltage regulator to track the off-chip voltage regulator as a function of the voltage identification signal.

11. The method of claim 10, wherein the integrated circuit includes a plurality of arrays and wherein the step of generating a voltage identification signal comprises the steps of:
   a. generating a global voltage identification sub-signal indicative of a current state of power usage by the on-chip logic circuit; and
   b. generating a plurality of array-specific voltage identification sub-signals, each array-specific voltage identification sub-signal indicative of an array-specific power usage parameter.

12. The method of claim 11, wherein each array has associated therewith a selected one of the plurality of array-specific voltage identification sub-signals and wherein each array has associated therewith a selected on-chip voltage regulator of a plurality of on-chip voltage regulators, wherein the step of causing the on-chip voltage regulator to track the off-chip voltage regulator includes causing a selected on-chip voltage regulator of the plurality of on-chip voltage regulators to supply an array-specific voltage that tracks both the global voltage identification sub-signal and a preselected array-specific voltage identification sub-signal.

13. The method of claim 12, wherein each of the plurality of array-specific voltage identification sub-signals indicates a predefined voltage offset associated with a corresponding array.

14. The method of claim 12, wherein at least one on-chip voltage regulator performs the step of driving more than one array.

* * * * *